United States Patent [19]

Purser

[11] 4,173,712
[45] Nov. 6, 1979

[54] ELECTRICAL CIRCUIT COMPONENT PROTECTING DEVICE

[75] Inventor: Kenneth H. Purser, Manchester, Mass.

[73] Assignee: General Ionex Corporation, Ipswich, Mass.

[21] Appl. No.: 937,954

[22] Filed: Aug. 30, 1978

[51] Int. Cl.² ............................................. H05K 9/00
[52] U.S. Cl. ............................. 174/35 R; 174/35 MS; 357/84; 361/111; 361/424
[58] Field of Search ............... 174/31.5, 35 R, 35 GC, 174/35 MS; 361/1, 111, 424; 357/84

[56] References Cited

U.S. PATENT DOCUMENTS

| | | | |
|---|---|---|---|
| 2,219,941 | 10/1940 | Rochow | 174/35 MS |
| 3,108,209 | 10/1963 | Knowles | 357/84 |
| 3,193,707 | 7/1965 | Yanai | 357/84 X |
| 3,982,058 | 9/1976 | Hill | 174/35 MS |

FOREIGN PATENT DOCUMENTS 53140  5/1937  Denmark ............................... 174/35 R

*Primary Examiner*—Harry E. Moose, Jr.

[57] ABSTRACT

A device for protecting electrical circuit components from surges induced by transient electromagnetic fields by isolating such components in a region of substantially uniform and constant field is disclosed. The device generally comprises at least two substantially identical conducting members in spaced, stacked relation, forming in the spaces between adjacent members a central component receiving region of substantially uniform and constant field surrounded in turn by a transitional region, a high energy storage region, and a second transitional region such that under surge conditions the device will remain electrically stable and the energy of the surge will be stored in the high energy storage region leaving the component protecting region substantially unaffected.

5 Claims, 2 Drawing Figures

ELECTRICAL CIRCUIT COMPONENT PROTECTING DEVICE

BACKGROUND (1) Field of Invention

The present invention relates generally to means for protecting electrical circuit components, and more particularly to means for protecting such components from damaging surge effects caused by hostile, external, high intensity, transient electromagnetic fields.

(2) Summary of the Prior Art

Designers of high voltage, laser, and similar equipment have understood for many years that while commonly available circuit components such as resistors, inductors, rectifiers, and even solid state elements are substantially failure free devices under DC operating conditions, the necessity of locating such components in regions in which high intensity transient electromagnetic fields are possible, or are prone to occur, renders such components vulnerable to failure due to the induced surge effects caused by such transient fields. Accordingly, it is well recognized that circuit components which are vulnerable to external transient fields must either be strong enough to withstand an induced surge or be protected therefrom. The use of components having electrical ratings which indicate an ability to withstand expected surge levels is unattractive due to the extreme cost differential between such special components and those more commonly available.

The primary emphasis for the designer has thus been to protect the components in the most efficient manner possible. In theory this goal can be accomplished either by isolating the component in a substantially uniform constant field unaffected by the transient or by adding components to the circuit whose sole function is to draw off surges before they can destroy an important component. In practice, however, the latter is the alternative which has been consistently chosen. By using well known filtering techniques, such as connecting a capacitor in parallel with the component to be protected, designers have been able, at less cost than that of special components, to provide at least moderate levels of protection for components subjected to low level surges. It must be recognized, however, that this level of protection is imperfect especially with respect to surges caused by high intensity transients, and is expensive in terms of added circuit complexity, and weight and space considerations as well as in terms of money.

The former of the above-stated alternatives has heretofore not been given serious consideration for reasons which will become apparent below.

The most common means for creating a region of substantially uniform electric field is the common parallel plate capacitor which is known to have such a field in the region between the central portions of the respective plates. The problem is that localized field stresses and nonuniformities particularly at the edges of parallel plate capacitors set the break down value of the whole assembly at a significantly lower level than would be theoretically expected from a consideration of the dielectric strength of the material between the plates alone. This in turn means that capacitance, potential across the plates, and electric field between the plates are all limited. Accordingly, a component located in the region between the central portions of adjacent plates would be substantially isolated from transient field induced surge effects only so long as the break down value of the assembly was not reached, this value being significantly lower than the generally expected to be induced by the high intensity transients common in high voltage equipment.

Certain workers in the art, specifically C. S. Franklin in U.S. Pat. No. 1,628,659, F. S. Smith in U.S. Pat. No. 1,836,195 and R. J. Van DeGraaff in U.S. Pat. No. 3,296,826, have noted that edge effects apparent in parallel plate capacitors can be reduced and capacitance, potential across plates and electric field between plates may be increased if the plates are identically dished in shape and separated by a layer of dielectric material of variable width, thickest adjacent to the edges and in the region of greatest curvature and gradually tapered to a constant lesser thickness in the region in between. These teachings have been useful in providing high capacitance devices to the electric-arts, but the geometries of such devices are such that the regions of substantially uniform electric field are not suitable for protecting components both because they are extremely thin and because the fields would not remain uniform under surge conditions.

Similarly, A. N. Hovland in U.S. Pat. No. 1,139,976, has shown that capacitance may be increased by extending the layer of dielectric separating the conductive members of a capacitor beyond the edges of the conductive members of increase flashover distance, and that such devices may be made in the form of truncated cones and stacked if space is a problem. The hollow space created between two stacked Hovland devices is surrounded by conductive materials which is generally at the same potential level and thus has a relatively small field. The space is not isolated from the effects of transient induced surges however, and accordingly is not suitable for electrical circuit component protection.

SUMMARY OF THE PRESENT INVENTION

The present invention provides a device for isolating the component to be protected in a substantially uniform electric field, which field will remain substantially unaffected by external high intensity transient fields, by providing a capacitive protecting device having a plate geometry which permits substantially uniform fields adjacent the central portions of the plates surrounded by regions of high capacitance. More specifically the present invention contemplates a capacitive component protecting structure capable of storing the energy of a surge induced by a transient field in a region surrounding an isolated region thereby leaving the isolated region unaffected by the surge. This structure is generally contemplated to include at least two substantially identical conducting members in space, stacked relation, each member separated from each of its neighbors by a layer of dielectric material adapted to allow the location of a component in the region between the adjacent sides of the central portions of adjacent conductive members. In a preferred embodiment each conductive member is contemplated to have a flange adjacent to its periphery, a substantially flat central area, and a wall portion connecting the interior of the flange to the outer edges of the central area thereby enclosing a frustrumic volume of substantially any desired cross-sectional shape. The connections of the wall portion to the flange and the central area preferably are in the form of very gradual curves, approximating Rogowski contours, to avoid field stress concentrations which could severely limit the break down strength of the entire device. Additionally, the present invention contemplates that means will be provided in the conductive members for connecting the protected component with the remainder of its circuit.

It is thus an object of the present invention to provide a device suitable for isolating electric circuit components from high intensity transient electromagnetic fields.

It is also an object of the present invention to provide a protective device for electrical circuit components which is extremely efficient yet comparatively simple and inexpensive to manufacture.

Further, it is an object of the present invention to provide a protective device for electrical circuit components which has effective electrical characteristics for component protection while at the same time being of a physically rugged construction adaptable to highly efficient space utilization configurations.

BRIEF DESCRIPTION OF THE DRAWINGS

These, as well as other features, objects, and advantages of the present invention, will be more clearly understood by reference to the following detailed description of a preferred embodiment of the present invention and to the drawings in which.

DETAILED DESCRIPTION OF PREFERRED EMBODIMENT

Figure 1:
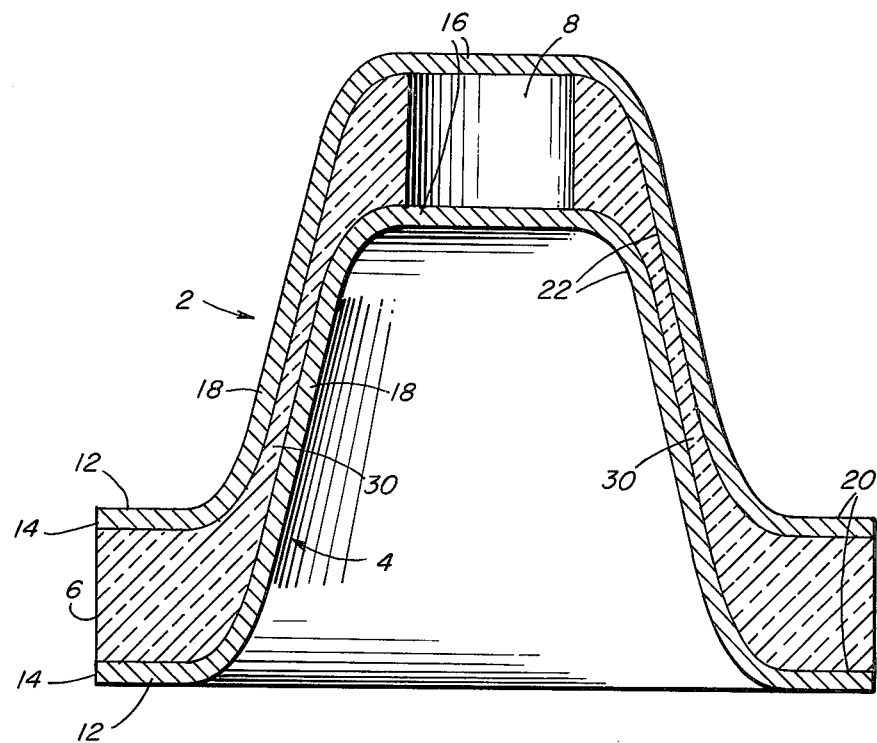
FIG. 1 is a cross-sectional view of an exemplary device made in accordance with the present invention.

Referring to the drawing, the cross-sectional view of FIG. 1 shows an electrical circuit component protecting device including two nested conductive members, 2 and 4, separated by dielectric material 6 defining a component protecting region 8 in accordance with the principles of the present invention. Each conductive member is of substantially uniform thickness and is formed such that it has a substantially flat flange 12 adjacent to its periphery 14, a substantially flat inner portion 16, and a wall portion 18 connecting the flange 12 with the central portion 16. For reasons which will become apparent later the connection between wall portion 18 and flange 12 on side 20 of said conductive members and the connection between wall portion 18 and inner portion 16 on side 22 of said conductive members are gradual curves, approximating Rogowski contours. The volume defined by the wall portion 18 and the central portion 16 is frustrumic (that is it defines that portion of the volume of a solid having an axis whose cross section transverse to said axis increases along said axis, which portion is bounded by two parallel planes intersecting said axis) and, while shown in the drawings as circular in cross-section for convenience, may be of substantially any desired cross-sectional shape which will efficiently make use of the available space in the equipment in which it is to be used. The nesting angle, that is the angle the wall portion 18 makes with a line normal to the center of central portion 16, may similarly be varied according to considerations of component size, available space in the equipment, and expected transient field intensity.

The dielectric material 6 which fills the regions between the flanges, wall portions, and connections of the wall portions to the flanges and to the inner portions of adjacent conductive members may be either solid or gaseous according to the level of capacitance desired, however, if it is gaseous provision must be made to maintain plate separation. In many cases this may be easily accomplished by the component's location in protected region 8, and accordingly is believed to be well within the skill of workers in the art. Similarly, means such as an opening in the inner portion of each plate for allowing connection of the protected component to its circuit and (or for controlling the atmosphere in the protected region 8 are contemplated but will not be discussed in detail as the various alternatives are clearly within the skill of the art.

In operation it will be seen that the effect of a transient electric field will be to induce a redistribution of the charge on the surface of the plates, and that this redistribution wall, because of the phenomenon of skin effect, start on the sides of the plates adjacent the external environment and proceed around the edges of the plates and thence inwardly along the surface adjacent to the dielectric. The geometry of the present device allows very high fields in the regions 30, and thus very high energy storage, because the dielectric thickness varies directly with the field stress concentration. Accordingly, the majority of the energy induced by a transient field will be stored in the high field regions 30 and the field in protected region 8 will remain substantially uniform.

Figure 2:
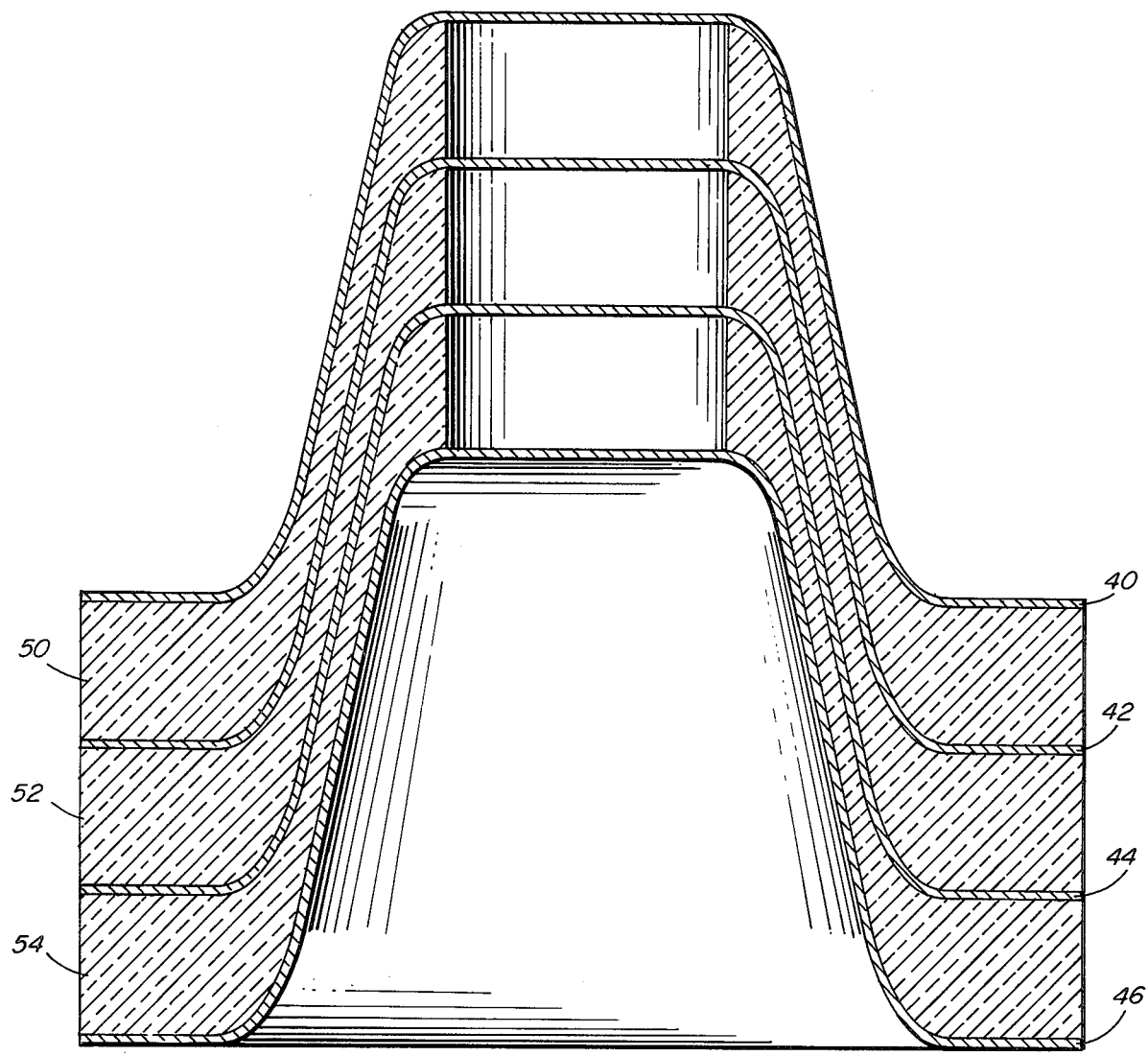
FIG. 2 is a cross-sectional view of a modification of the embodiment shown in FIG. 1 suitable for use in protecting a series of connected circuit components, and particularly useful in situations wherein extremely high transitory field effects are anticipated.

FIG. 2 shows a modification of the above wherein a plurality of plates 40, 42, 44, 46, separated by layers of dielectric material 50, 52, 54, are nested together forming a series connected capacitive component protecting device. This device is representative of the fact that substantially any number of plates may be nested as above to create a required number of component protecting regions. An added benefit of this construction is that it allows induced surges caused by very intense transient fields to be divided over the whole column and consequently the device is extremely stable electrically.

It should further be understood that the embodiments and practices described and portrayed herein have been presented by way of disclosure, rather than limitation, and that various substitutions, modifications, and combinations may be effected without departure from the spirit and scope of this invention in its broader aspects. For example, the conductive members 40, 42, 44, 46 and the layers of dielectric material 50, 52, and 54 shown in FIG. 2 need not be of the same thickness respectively. Thus, the device shown in FIG. 2 can easily be modified to provide a graded capacitive structure without departure from the principles of the present invention.

I claim:

1. A device for protecting electrical circuit components from the effects of transient electromagnetic fields in the external environment surrounding the device comprising at least two substantially identical conductive members in spaced, stacked relation; each said conductive member comprising a substantially flat, permissibly apertured, inner portion, a substantially flat flange portion adjacent its periphery, and a wall portion inclined outwardly relative to said central portion, said wall portion connected to said flange portion and to said inner portion by first and second gradually sloping arch portions respectively; and a layer of dielectric material filling the spaces between each conductive member and the conductive members adjacent thereto, each said layer being adapted to allow the location of an electrical circuit component in the region between the inner portions of adjacent conductive members; said device thereby defining in the spaces between adjacent conductive members a component protecting region between adjacent inner portions surrounded in turn by a first transitional region between adjacent second arch portions, a high energy storage region between adjacent wall portions, and a second transitional region between adjacent first arch and flange portions, such that the device will remain electrically stable under surge conditions and the energy of a surge will be stored in the high energy storage region leaving the component protecting region substantially unaffected.

2. The device of claim 1 wherein the dielectric material is gaseous.

3. The device of claim 1 wherein the dielectric material is gaseous in the region between the inner portions of adjacent conductive members and solid elsewhere.

4. The device of claim 1 wherein the conductive members are of different thicknesses and the relative thicknesses of the layer of dielectric between adjacent conductive members is different between each pair of conductive members.

5. The device of claim 1 further comprising means in each of said conductive members for connecting an electrical circuit component located within the region between the inner portions of adjacent conductive members to the remainder of its circuit.

* * * * *